(12) United States Patent
Karim et al.

(10) Patent No.: US 10,514,471 B2
(45) Date of Patent: Dec. 24, 2019

(54) APPARATUS FOR RADIATION DETECTION IN A DIGITAL IMAGING SYSTEM

(71) Applicant: KA IMAGING INC., Kitchener (CA)

(72) Inventors: Karim S. Karim, Waterloo (CA); Sina Ghanbarzadeh, Kitchener (CA)

(73) Assignee: KA IMAGING INC., Kitcheber, ON (CA)

( * ) Notice: Subject to any disclaimer, the term of this patent is extended or adjusted under 35 U.S.C. 154(b) by 0 days.

(21) Appl. No.: 15/975,366

(22) Filed: May 9, 2018

(65) Prior Publication Data
US 2018/0329084 A1 Nov. 15, 2018

Related U.S. Application Data

(60) Provisional application No. 62/503,408, filed on May 9, 2017.

(51) Int. Cl.
*G01T 1/24* (2006.01)
*H01L 27/146* (2006.01)

(52) U.S. Cl.
CPC .............. *G01T 1/241* (2013.01); *G01T 1/247* (2013.01); *H01L 27/14663* (2013.01)

(58) Field of Classification Search
None
See application file for complete search history.

(56) References Cited

U.S. PATENT DOCUMENTS

| | | | | |
|---|---|---|---|---|
| 6,075,248 A | * | 6/2000 | Jeromin | H01L 27/14603 250/370.08 |
| 7,223,982 B1 | * | 5/2007 | Chen | G01T 1/2928 250/370.01 |
| 7,633,566 B2 | * | 12/2009 | Utsunomiya | G06F 3/044 345/174 |
| 2002/0079456 A1 | * | 6/2002 | Lingren | H01L 27/14659 250/370.01 |
| 2007/0053493 A1 | * | 3/2007 | Bijlsma | H01L 27/14603 378/98.8 |
| 2009/0283689 A1 | * | 11/2009 | Mochizuki | H01L 27/14663 250/370.14 |
| 2009/0321643 A1 | * | 12/2009 | Rutten | H01L 27/14658 250/338.4 |
| 2010/0193670 A1 | * | 8/2010 | Kanbe | H01L 27/14609 250/214.1 |
| 2010/0201834 A1 | * | 8/2010 | Maruyama | H01L 31/18 348/222.1 |
| 2012/0267513 A1 | * | 10/2012 | Jeon | H01L 27/1446 250/208.2 |
| 2014/0184942 A1 | * | 7/2014 | Bang | G02F 1/13338 349/12 |
| 2014/0231657 A1 | * | 8/2014 | Bolotnikov | G01T 1/247 250/370.06 |

(Continued)

*Primary Examiner* — Yara B Green
(74) *Attorney, Agent, or Firm* — Gowling WLG (Canada) LLP; Jeffrey W. Wong

(57) ABSTRACT

The disclosure is directed at a detector element that includes a conductive shield electrode, or shield electrode layer that can assist in reducing breakdown and also improve the reliability of the detector element. The detector element includes a substrate layer that supports at least two electrodes and a semiconducting layer. A shield electrode layer is deposited or patterned adjacent at least one of the two electrodes.

20 Claims, 15 Drawing Sheets

(56) References Cited

U.S. PATENT DOCUMENTS

| | | | |
|---|---|---|---|
| 2015/0287760 A1* | 10/2015 | Karim | H01L 27/14663 257/53 |
| 2016/0131769 A1* | 5/2016 | Wieczorek | G01T 1/2018 250/369 |
| 2018/0061876 A1* | 3/2018 | Miyamoto | G01T 7/00 |

* cited by examiner

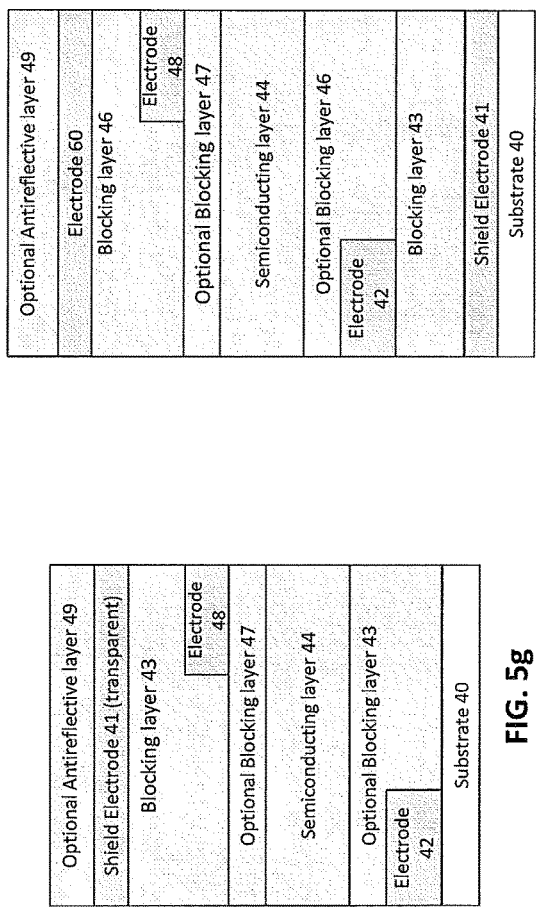
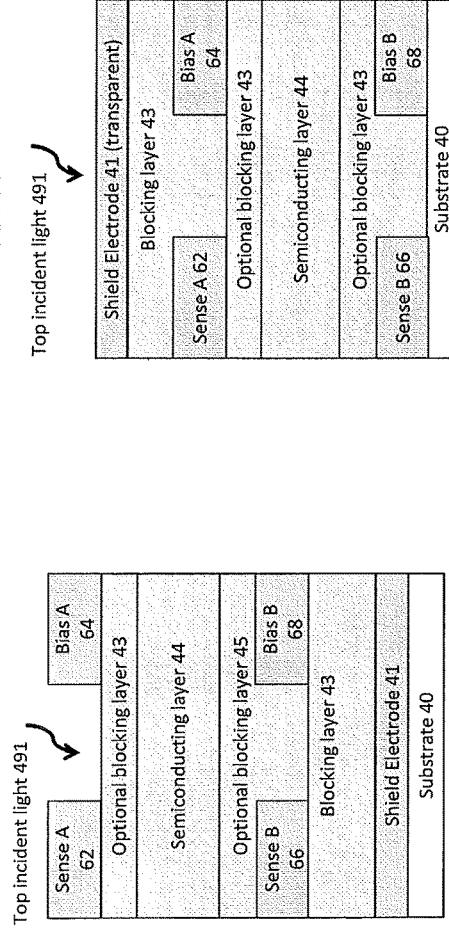
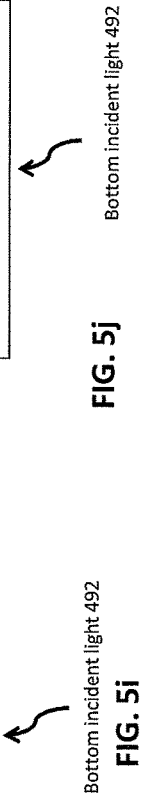
FIG. 5h
FIG. 5j
FIG. 5g
FIG. 5i

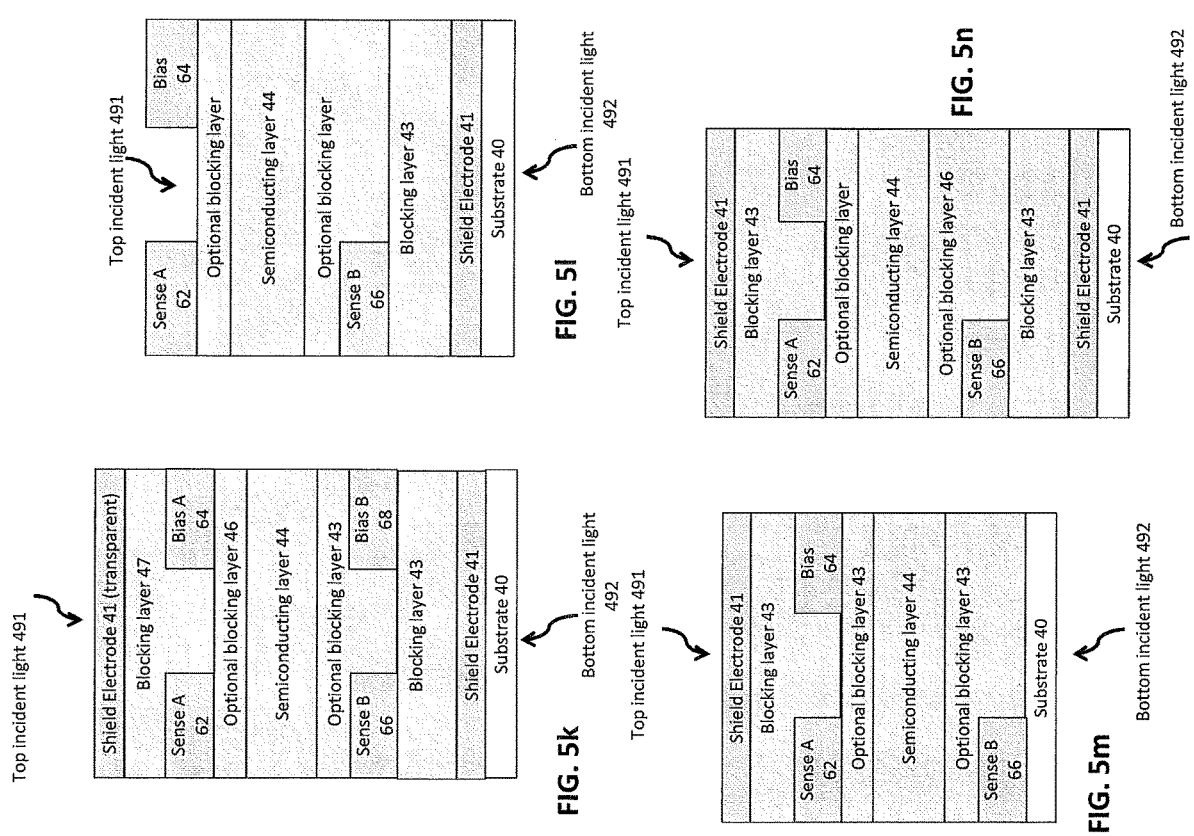

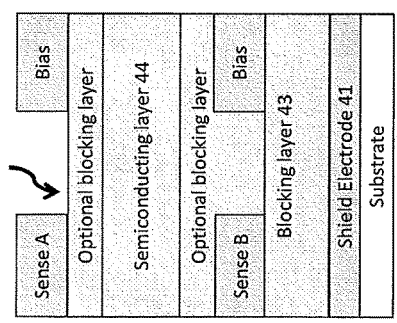
FIG. 5p
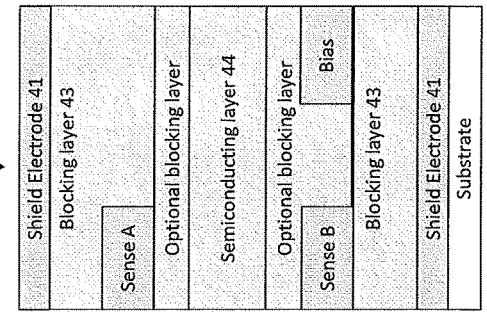
FIG. 5r
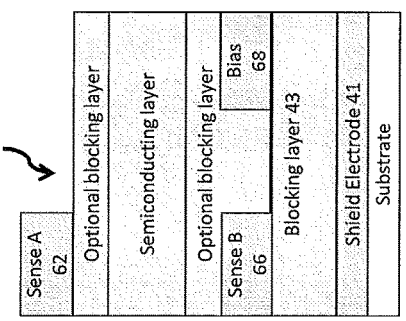
FIG. 5o
FIG. 5q

FIG. 5s
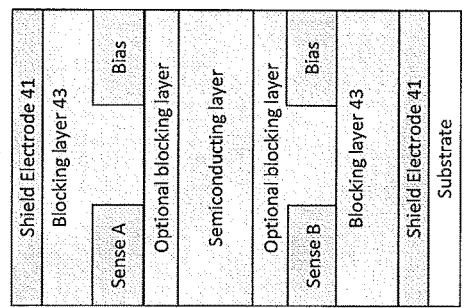
FIG. 5t
FIG. 5u
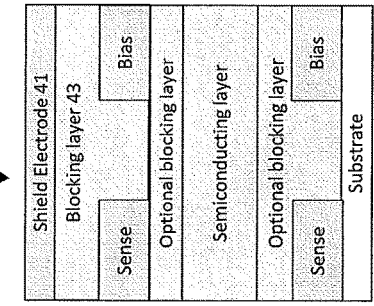
FIG. 5v

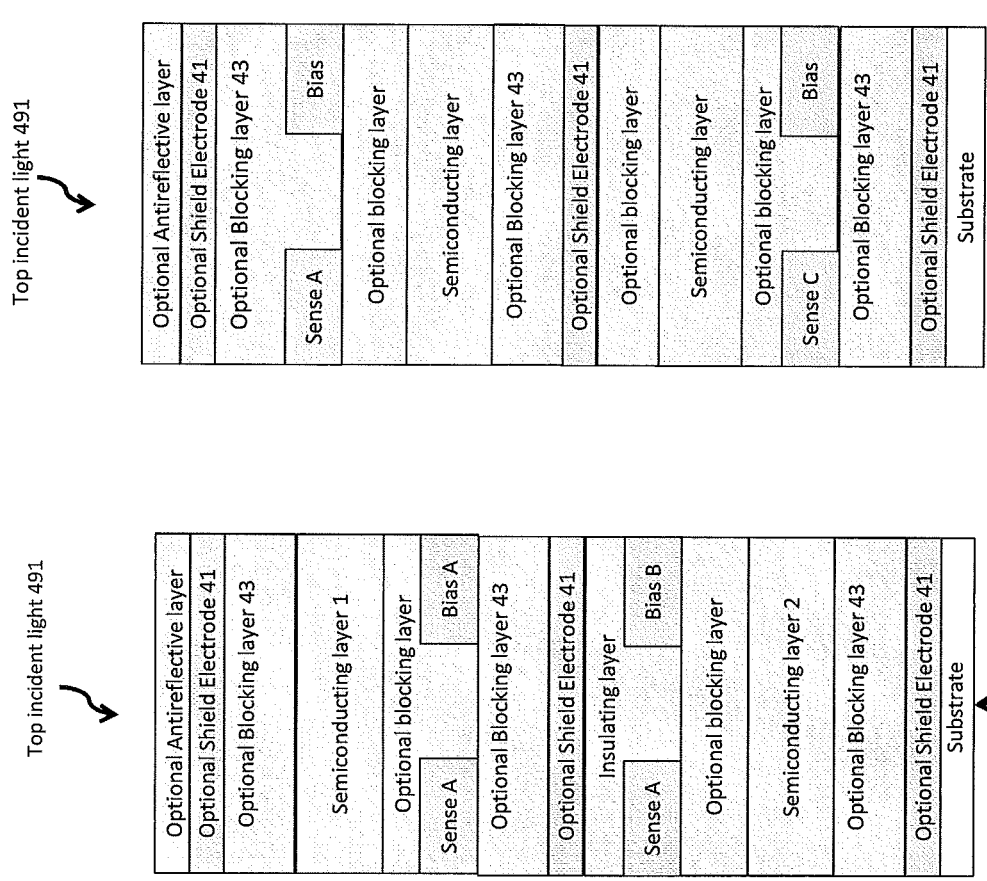

ical charges. Depending on
APPARATUS FOR RADIATION DETECTION IN A DIGITAL IMAGING SYSTEM

CROSS-REFERENCE TO RELATED APPLICATIONS

This application claims priority from U.S. Provisional Application No. 62/503,408 filed May 9, 2017, which is hereby incorporated by reference.

FIELD OF THE DISCLOSURE

This disclosure relates generally to digital imaging systems, and more particularly to an apparatus for radiation detection in a digital imaging system.

BACKGROUND OF THE DISCLOSURE

Traditionally, X-ray diagnostic processes record x-ray image patterns on silver halide films. These systems direct an initially uniform pattern of impinging X-ray radiation through the object to be studied, intercept the modulated pattern of X-ray radiation with an X-ray radiation intensifying screen, record the intensified pattern on a silver halide film, and chemically transform the latent pattern into a permanent and visible image called a radiograph.

Radiographs are produced by using layers of radiation sensitive materials to directly capture radiographic images as modulated patterns of electrical charges. Depending on the intensity of the incident X-ray radiation, electrical charges, generated either electrically or optically by the X-ray radiation within a pixel area, are quantized using a regularly arranged array of discrete solid-state radiation sensors.

Recently, there has been rapid development of large area, flat panel, digital X-ray imagers for digital radiology including active matrix technologies used in large area displays. An active matrix includes a two-dimensional array (of which, each element is called a pixel) of thin film transistors (TFTs) made with a large area compatible semiconductor material. There are two general approaches to making flat-panel x-ray detectors, a direct approach or an indirect approach.

The direct approach primarily uses a thick photoconductor film (e.g. amorphous selenium) coupled directly to the active matrix as the X-ray to electric charge converting layer. In the indirect approach, a phosphor screen or scintillator (e.g. CsI, GdOS etc.) is used to convert X-rays to light photons which are then converted to electric charge using an additional pixel level light sensor fabricated with the TFT on the active matrix array.

The key challenges with fabricating a vertical photodiode are the modifications required to the TFT fabrication process specifically, thick amorphous silicon layers, specialized p-doped contact layer and a complex reactive-ion etching (RIE) sidewall etching process to prevent optical crosstalk. These challenges reduce the fabrication yield and drive up the cost of manufacture. The key challenges with fabricating a lateral MSM photoconductor include the high dark currents at higher electric fields and photoresponse non-uniformity due to a non-uniform electric field. In addition, the lateral MSM photoconductor is not space efficient leading to low effective quantum efficiency (EQE). Each of these issues degrades imager performance, which is the key reason why MSM devices are not used in industry today for large area digital X-ray imaging.

Therefore, there is provided a novel method and apparatus for radiation detection in a digital imaging system.

SUMMARY OF THE DISCLOSURE

In one aspect of the disclosure, there is provided a detector element for a digital imaging system including a first electrode; a second electrode; a semiconducting layer, located between the first and second electrode; and a conductive shielding electrode layer adjacent to one of the first or second electrode.

In another aspect, the detector element further includes at least one insulating blocking layer. In yet another aspect, the detector element further includes a substrate layer. In an embodiment, the shielding electrode layer is adjacent the substrate layer. In another embodiment, the shielding electrode layer is located away from the substrate layer. In a further embodiment, when the shielding electrode is located away from the substrate layer, the shielding electrode layer is transparent.

In another aspect, the shielding electrode layer is shaped to shield at least one of the first or second electrode from X-ray radiation. In another embodiment, the shielding electrode layer is shaped to shield a space between the first and second electrode when the first and second electrode are horizontally spaced. In a further aspect, the shielding electrode extends a width of the substrate layer. In yet a further aspect, the shielding electrode is manufactured from a conductive material wherein the conductive material may be aluminum, chrome, molybdenum or indium tin oxide.

In yet another aspect, the semiconductor layer is manufactured from at least one of amorphous silicon, metal-oxide, polysilicon and an organic semiconductor material. In another aspect, the blocking layer is manufactured from at least one of polyimide, benzocyclobutane (BCB), parylene, polystyrene or polysiloxane. In another aspect, the detector element is a Metal-Insulator-Semiconductor-Insulator-Metal (MISIM) detector element. In yet a further aspect, the detector element further includes an antireflective layer.

BRIEF DESCRIPTION OF THE DRAWINGS

Embodiments of the present disclosure will now be described, by way of example only, with reference to the attached Figures.

DETAILED DESCRIPTION

The present disclosure relates to an apparatus for radiation detection in a digital imaging system. The apparatus may include a photoconductive element that includes a detector element, such as a metal-insulator-semiconductor-insulator-metal (MISIM) detector element and a shield, or shielding electrode or electrode layer. In another embodiment, the detector element is integrated with a readout circuit element for a radiography imaging system.

Figure 1:
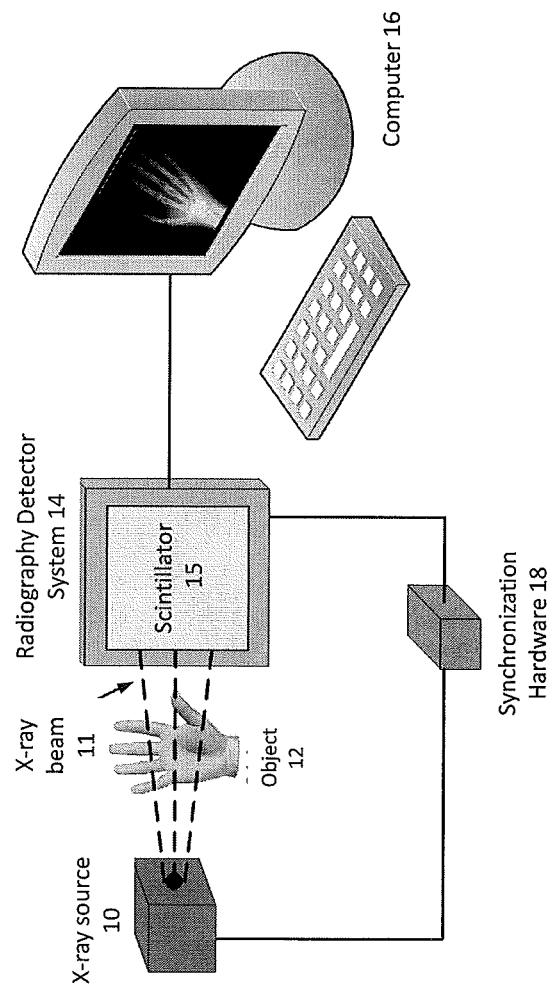
FIG. 1 illustrates a general diagram of a radiographic imaging environment.

FIG. 1 illustrates a general diagram of a radiographic imaging environment. As shown, an X-ray source 10 generates an X-ray beam, or x-rays, 11 that is transmitted towards an object 12, e.g. a patient's hand, for imaging by a radiography detector system (RDS) 14. The results of the X-ray may be viewed on a computer 16. In the current embodiment, which may be seen as an indirect imaging system, the radiography detector system 14 includes a scintillator 15. In a direct imaging system, the x-rays 11 generate electronic charge within the radiography detector system 14 and there is no need for the scintillator 15.

For some radiography detector systems 14, synchronization hardware 18 is necessary to obtain the correct timing between the X-ray source 10 and the radiography detector system 14 that is sampling the impinging X-ray beam 11. In the present disclosure, the radiography detector system 14 includes a large area, flat panel detector based on active matrix technologies to achieve the imaging of object 12.

In general, the object 12 to be imaged is positioned between the radiation source 10 and the radiography detector system 14. X-rays 11, which pass through the object 12 interact with the radiography detector system 14. In indirect imaging, the x-rays 11 generate light photons as they pass through a phosphor screen or scintillator 15, such as structured Cesium Iodide (CsI), Gadolinium oxysulfide (GOS) or Calcium Tungsten Oxide (CaWO4). These indirectly generated light photons then further generate electronic charge within the radiography detector system 14.

Figure 2:
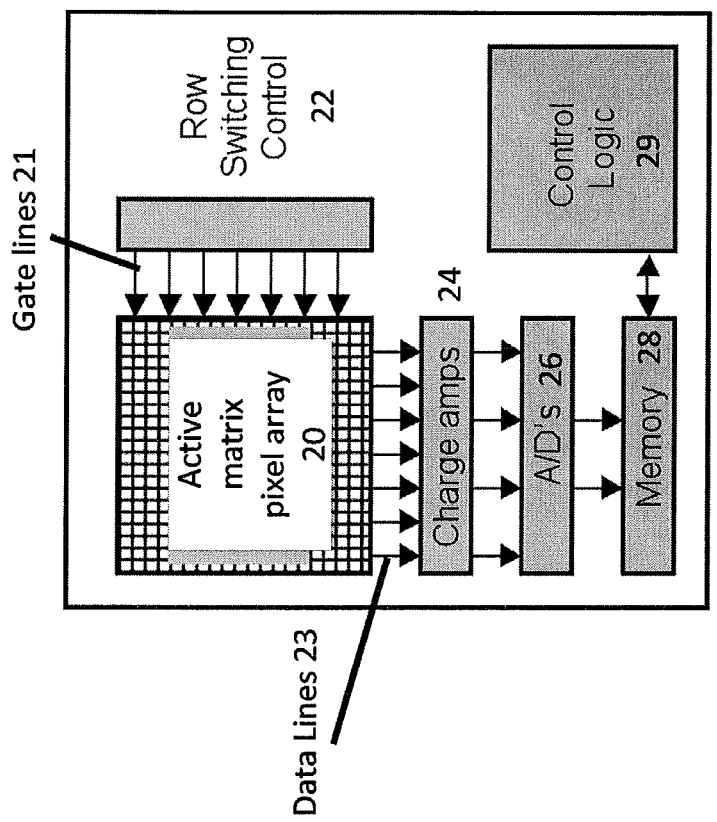
FIG. 2 illustrates a two-dimensional active matrix imaging array structure.

FIG. 2 is a schematic diagram of the radiography detector system 14. The RDS 14 includes an active matrix pixel array 20 having a two-dimensional matrix of pixel elements where electronic charges generated directly or indirectly by incident x-rays are sensed and stored. In order to access the stored charge at each pixel, gate lines 21 are driven typically sequentially by a row switching control 22 causing all pixels in one row to output their stored charge onto data lines 23 that are coupled to charge amplifiers 24 at the end of each active matrix pixel array 20 column. The charge amplifiers 24 send the pixel charge data to analog-to-digital converters (A/D's) 26, where the analog signal is converted to a digital representation. The digital representation is then stored in memory 28 awaiting transmission to the computer 16 at a time determined by the control logic 29. The charge amplifiers may also perform a multiplexing function in addition to their amplifying function.

Figure 3:
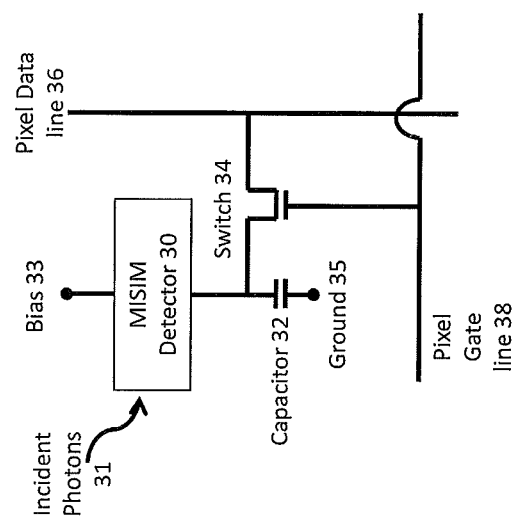
FIG. 3 illustrates a pixel circuit.

FIG. 3 is a schematic diagram of one embodiment of a pixel level circuit for one pixel in the active matrix pixel array 20 described in FIG. 2. The active matrix pixel array 20 typically contains a plurality of pixels. Within each pixel is a two terminal MISIM detector element 30 that absorbs the incident photons and generates electronic charge. A two terminal optional capacitor 32 stores the converted electronic charge and a readout circuit element, usually a three electrode thin film transistor (TFT) switch 34 transfers the electronic charge off the pixel. One electrode of the MISIM detector element 30 is connected to a high potential bias terminal 33 that is shared with other pixels in the active matrix pixel array 20 and one electrode of the capacitor 32 is connected to a low potential ground terminal 35 which is also shared with other pixels in the active matrix pixel array 20. The drain electrode of the TFT switch 34 is connected to the second electrode of the MISIM detector 30 and the second terminal of the capacitor 32. The source electrode of the TFT 34 is connected to the pixel data line 36, which is coupled to one of the plurality of data lines 23 described in FIG. 2. The gate electrode of the TFT 34 is connected to the pixel gate line 38, which is coupled to one of the plurality of gate lines 21.

Figure 4A:
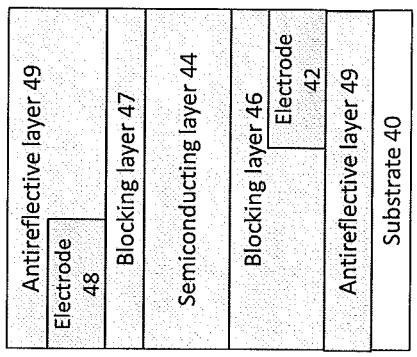
FIGS. 4a to 4c illustrate cross-sections of known Metal-Insulator-Semiconductor-Insulator-Metal (MISIM) detector elements.

Turning to FIG. 4a, a schematic diagram of a first embodiment of a known MISIM detector element 30 with the electrodes in a staggered configuration is shown. The detector element 30 includes a substrate layer 40 atop which an optical anti-reflective layer 49 is deposited. A first contact, or electrode, layer 42, is deposited or patterned atop the antireflective layer 49. A first blocking layer 46 is deposited atop the anti-reflective layer 49 substrate layer 40 encapsulating the first electrode 42. A semiconductor, or semiconducting, layer 44 is deposited atop the first blocking layer 46 and then a second blocking layer 47 deposited atop the semiconductor layer 44. As can be seen, the first and second blocking layers 46 and 47 are located on opposite surfaces of the semiconductor layer 44 from each other.

A second electrode 48 is deposited, or patterned, atop the second blocking layer 47. As shown in FIG. 4a, the first and second electrodes can be seen as being on opposite sides of the semiconductor layer 44. In some embodiments, the anti-reflective layer 49 is optional and is not necessary for operation of the MISIM detector element 30. However, in indirect conversion imaging, the anti-reflective layer 49 enhances performance by increasing the percentage of light photons impinging on the semiconducting layer 44 where photons are absorbed. As it can be seen in FIG. 4a, the optional antireflective layer 49 can be placed on top of the MISIM detector element 30 or on the bottom of MISIM detector element 30 based on the placement of the scintillator with respect to the MISIM detector element 30 or in both locations.

As can be seen in FIG. 4a, the first and second electrodes are staggered with respect to each other in a plane perpendicular to the semiconducting layer 44. In other words, with respect to the vertical detector of FIG. 4a, the first electrode is separated horizontally from the second electrode and does not overlap the second electrode in the vertical plane. In a preferred embodiment, the first and second electrodes do not overlap each other. Either one of the blocking layers 46 or 47 may serve a dual function as a blocking layer and an anti-reflective layer.

In the current embodiment, one of the first or second contacts is coupled to either the first or second blocking layer(s) or both. In some embodiments, where higher dark currents and lower EQEs are acceptable, either the first 46 or second 47 blocking layers or both may be replaced with ohmic and/or Schottky contacts. Besides X-ray digital imaging, other applications of the MISIM detector element could include biometric fingerprint imaging, touch displays and gesture displays. In biometric fingerprint imaging, the MISIM detector element would need to be sensitive not only to optical wavelengths but also near infrared (600-900 nm) for multi-spectral imaging. This can be accomplished by changing the thickness of the semiconductor layer 44 so that the semiconductor can absorb infrared wavelengths along with optical. Alternately, the semiconductor layer 44 could be replaced with a material having an enhanced sensitivity to infrared such as silicon nanowires, quantum dots, or other suitable inorganic or organic semiconducting material. For touch or gesture displays, because the MISIM detector element has a straightforward fabrication process and in a preferred embodiment, is directly compatible with large area thin film electronics processing, the MISIM detector element can be integrated directly into thin film LCD, OLED and LED displays to yield a high performance, cost-effective, display-sensor pixel unit.

Figure 4C:
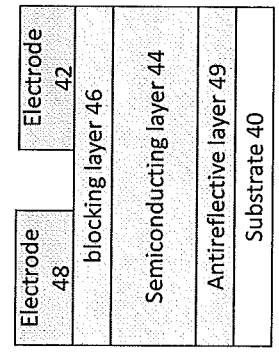
Figure 4B:
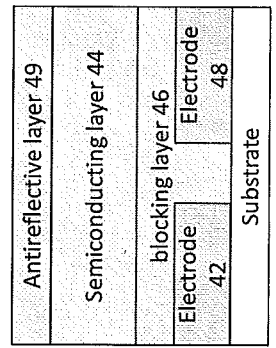

Turning to FIG. 4b, a schematic diagram of a second embodiment of a MISIM detector element 30 in a bottom electrode configuration is shown. The detector element 30 includes a substrate layer 40 atop of which the first and second electrode 42 and 48 respectively are deposited or patterned. A first blocking layer 46 is deposited atop the substrate layer 40 encapsulating at least one of the first electrode 42 and second electrode 48. A semiconductor layer 44 is deposited atop the first blocking layer 46 and then an optional antireflective layer 49 is deposited atop the semiconductor layer 44.

FIG. 4c shows a cross-section of a third embodiment of the MISIM detector 30 in a bottom electrode configuration. In this embodiment, the substrate layer 40 supports the antireflective layer 49, the semiconducting layer 44, the optical blocking layer and the pair of the patterned contact electrode layers containing electrode 42 and electrode 48.

As with the embodiment of FIGS. 4a, 4b and 4c, either of the electrode 42 or electrode 48 can be selected to be connected to the bias 33 or switch 34 (of FIG. 3).

As with the embodiment of FIG. 4a, the electrodes, may be seen to be staggered with respect to each other, both in the horizontal plane and the vertical plane. Again, in some embodiments, where higher dark currents and lower EQEs are acceptable, either of the blocking layers or both may be optional or can be replaced with ohmic and/or Schottky contacts.

Dark current is a key problem with traditional MSM detectors because it reduces the detector dynamic range and image quality and is a function of the electric field applied on the bias contact (seen as either electrode 42 or electrode 48). A large electric field is necessary for charge separation of the electronic carriers generated from the impinging photons on the semiconducting layer 44. If photocurrent can be maintained at a high level while dark current is reduced or alternately, a higher electric potential may be applied to the bias contact (either electrode 42 or electrode 48) to increase charge separation efficiency and correspondingly the photocurrent, without increasing the dark current, then a larger photo-to-dark current ratio is possible which equates to better dynamic range, higher contrast, higher quantum efficiencies and better digital images. Neither ohmic nor Schottky contacts for the electrode 48 and electrode 42 contacts have to date been able to achieve the dark current densities necessary for sensitive medical radiography imaging applications (around 10 pA/mm² or less). However, for less stringent applications (e.g. in the biometric fingerprint scanning or touch sensing domains), ohmic and Schottky contacts may suffice.

In one aspect of the disclosure, the present disclosure uses a staggered MISIM contact architecture coupled with blocking layers (in place of ohmic of Schottky contacts) that simultaneously: (1) reduce dark current when there are no photons impinging on the semiconducting layer and (2) enable high photocurrents when photons impinge on the semiconducting layer.

To achieve these two goals, the material of the blocking layers 46 and 47 is carefully selected in order to: provide a low trap density interface with the semiconducting layer, prevent or reduce injection of charge carriers to the semiconducting layer from bias and sense electrode (e.g. have wide band-gap), and to have a dielectric strength such that it can be operated in soft (reversible) breakdown during device operation repeatedably when the applied bias and blocking layer 46 thickness are selected or optimized to account for both the dark conductivity and photoconductivity of the semiconducting layer 44 which is also a function of semiconducting layer 44 thickness, applied electric bias and material properties.

When photons are impinging on the semiconducting layer 44 thereby causing the resistivity of the semiconducting layer 44 to decrease, the blocking layer 46 operates in soft (i.e. reversible) breakdown mode allowing a vertical conduction path from bias 48 and sense contacts (or electrodes) 42 through the blocking layer 46 to the semiconducting layer 44. Operating in soft breakdown allows for conduction through the blocking layer 46 which may overcome the response time challenge while still maintaining a low dark current by limiting bias 48 and sense 42 contact injection currents. Using a blocking layer 46 that is too thick or one with a high dielectric breakdown strength can yield poor results or alternately, choice of an incompatible blocking layer 46 material can yield a poor interface with the semiconducting layer 44 so that traps and defects cause a drop in MISIM detector 30 quantum efficiency.

In experiments, it was determined that using a 450 nm amorphous silicon semiconducting layer 44 works well with a 200 nm polyimide blocking layer 46. This combination yields an interface with high EQE (above 65%) for green light. Alternately, if high external quantum efficiency is required for blue light, then, for the same amorphous silicon and polyimide material combination, the semiconducting layer 44 thickness may need to be reduced which requires a corresponding re-optimization of the blocking layer thickness 46. If the semiconducting layer 44 is changed from amorphous silicon to a metal oxide like IGZO (Indium Gallium Zinc Oxide) or even silicon, polysilicon or organic semiconductor, all of which have different material properties and absorption coefficients, the choice of blocking layer material (for interface purposes), thickness and maximum bias voltage applied may be reconsidered or re-optimized via calculation prior to manufacturing. Alternatives to polymide may include other soft polymers such as, but not limited to, benzocyclobutane (BZB or Cyclotene), parylene, polystyrene, polysiloxane and other related materials. Additional improvements in EQE are possible if an optional anti-reflective layer such as amorphous silicon nitride is used on top of the semiconducting layer directly in the path of the incident photons.

Moreover, it is noted that it is possible to pattern the blocking layer 46 and use either insulating contacts for both the bias 48 and sense 42 contacts or alternately, use an insulating contact for just one contact (e.g. either for the bias contact 48 or for the sense 42 contact depending on the bias used). It should be understood that ohmic and Schottky contacts can also be used depending on the application requirements.

A patterning process (e.g. of the bias 48 or sense 42 contacts or the blocking layer 46) can also potentially degrade the semiconducting layer 44 interface because of exposure to air and chemicals during the patterning process. Typically though, as shown in FIGS. 4a to 4c, the blocking layer running across both bias 48 and sense 42 contacts provides an improved interface with the semiconductor layer 44 with fewer defects and traps as well as encapsulating the semiconducting layer 44 thus maintaining higher quantum efficiency. In an alternative embodiment, MISIM detector elements where only one of the bias 48 or sense 42 contacts is insulated may be used if careful semiconductor processing is undertaken.

Moreover, as noted, the bias 48 and sense 42 contacts can be placed in various positions such as one each on opposite sides of the semiconducting 44 layer as long as they are separated by a horizontal distance so that photon absorption and transport remains in the horizontal (lateral) direction. Furthermore, if bias 48 and sense 42 contacts are made using transparent materials, both the top electrode or bottom electrode configuration can detect light photons equally well from either direction. Transparent materials include, but are not limited to, aluminum, molybdenum, chromium, indium tin oxide (ITO), zinc oxide (ZnO), indium gallium zinc oxide (IGZO), and poly (3,4-ethylenedioxythiophene) polystyrene sulfonate (PEDOT:PSS).

In other embodiments, to improve (1) lower sensor capacitance (which can be challenging for applications requiring high pixel dynamic range) and (2) sensor output current instability or non-uniformities for example, due to switching or other related noise source in adjacent pixel transistors and circuits (which can be challenging for low signal applications), a shielding electrode, or electrode layer, is integrated within the detector or detector element. The shield electrode can assist in reducing breakdown and improve the reliability of the photodetector. In another embodiment, the shield or shielding electrode is designed to shape the electric field near or around individual electrodes and/or between pairs of electrodes in the detector element. It would be understood that one shielding electrode may be used for all of the electric fields that are generated between electrodes or may be in a 1:1 relationship between shield electrode and generated electric field. Other ratios between shield electrode and electric field between electrodes are also considered. Unlike the blocking layer, which typically behaves like an insulator, the shield electrode is conductive. The shield electrode layer can be made from a variety of materials, including but not limited to, aluminum, chrome, molybdenum and indium tin oxide. The schematics in FIG. 5 provide a number of implementations of the shield electrode with a range of photodetector designs.

Figure 5B:
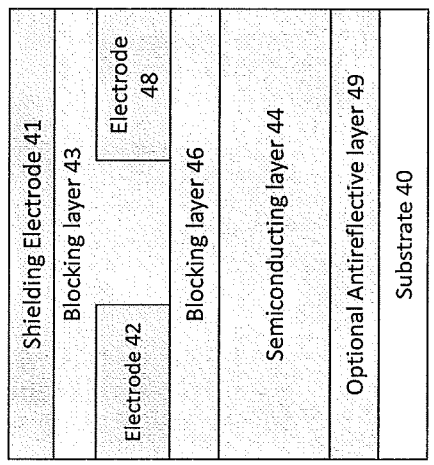
FIGS. 5a to 5ab illustrate cross-sections of Metal-Insulator-Semiconductor-Insulator-Metal (MISIM) detector elements with a shield electrode layer.
Figure 5A:
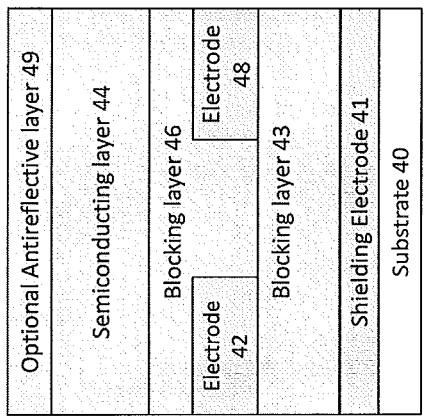

Turning to FIG. 5a, a schematic diagram of a first embodiment of a MISIM detector in bottom electrode configuration with a shielding electrode 41 is shown. Use of the shielding electrode or electrode layer provides further advantages over current systems. Firstly, the shielding electrode provides additional pixel capacitance when placed adjacent to the sense electrode (either 48 or 42 depending on the implementation), stabilizes the pixel dark current to a low consistent level and increases the pixel output signal current which leads to higher EQE by modifying the electric field at the edge of the bias electrode (42 or 48) or sense electrode (42 or 48).

As shown in FIG. 5a, the detector includes a substrate layer 40 atop which the shielding electrode layer 41 is deposited. Atop the shielding electrode 41 is a blocking layer 43 that may encapsulate the shielding electrode layer 41. A pair of electrodes 42 and 48 are then deposited, or patterned atop the blocking layer 43. The pair of electrodes can be seen as being separated horizontally from each other. In the current embodiment, a second blocking layer 46 is deposited or patterned atop the first blocking layer 43 encapsulating electrode 42 and electrode 48. A semiconductor, or semiconducting, layer 44 is deposited atop the second blocking layer 46 and then an optional antireflective layer 49 may be deposited on top of the semiconducting layer 44.

Although shown as having the same width as the substrate 40, the shield electrode 41 is not required to cover all area of the MISIM element 30 and may be patterned in between the electrode 42 and electrode 48 or covering in full or in part a portion of the electrode 42 and 48. The placement of the shield electrode 41 depends on the application and the level of required pixel capacitance, dark current and EQE.

In FIGS. 5b to 5ab, various MISIM pixel architectures including top electrode, bottom electrode and/or multi-sensor MISIM as well as staggered MISIM sensor are shown with the shield electrode incorporated for sensor performance improvement.

In FIG. 5b, the shielding electrode is located away from the substrate layer 40. In the embodiment of FIG. 5b, between the shielding electrode 41 and the substrate layer 40 is an optional anti-reflective layer 49, a semiconducting layer 44, a pair of blocking layers and the two electrodes 42 and 48.

Figure 5C:
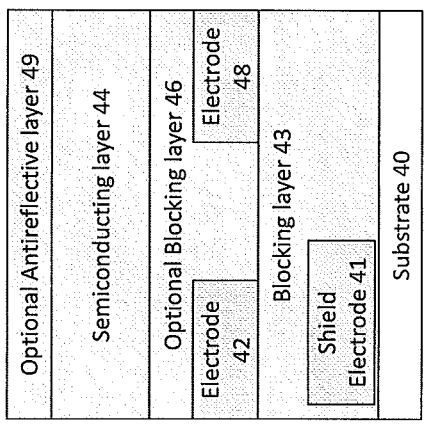
Figure 5D:
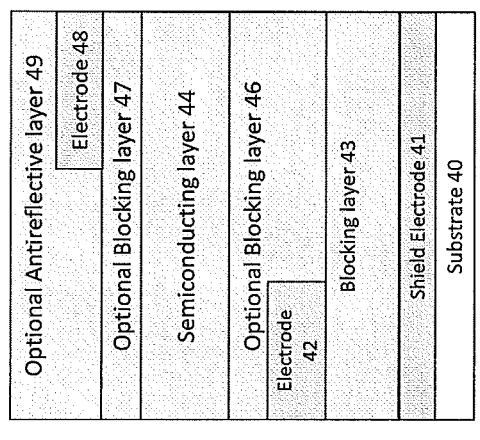
Figure 5E:
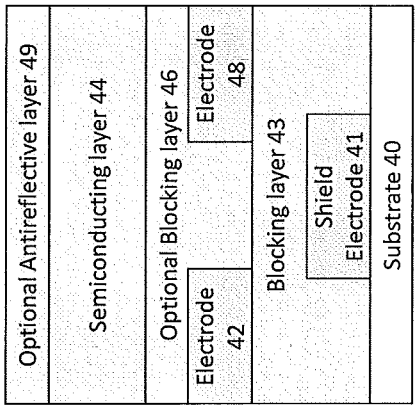

In FIG. 5c, the shield electrode 41 is located atop the substrate layer and is designed to be the same width as the space between the two horizontally spaced electrodes 42 and 48. In FIG. 5d, the shield electrode 41 is located atop the substrate layer 40 and is directly between the substrate and electrode 42. In FIG. 5e, the shield electrode 41 is located atop the substrate layer 40 and is directly between the substrate and electrode 48.

Figure 5F:
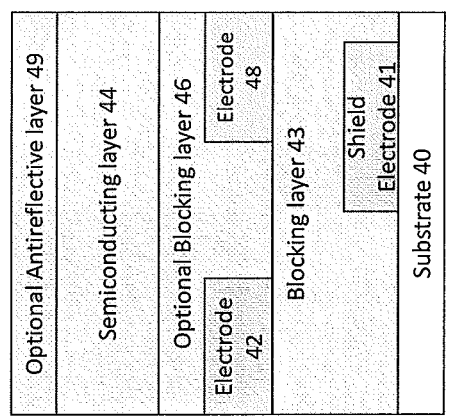

Turning to the embodiment of FIG. 5f, the shield electrode is located atop the substrate layer 40 and shields both electrodes 42 and 48.

Turning to FIG. 5g, the shield electrode 41, which in the current embodiment may be transparent, is located between an antireflective layer 49 and a blocking layer 43 away from the substrate layer 40. In the embodiment of FIG. 5h, the shield electrode 41 is located atop the substrate layer. The detector 30 may include a plurality of blocking layers 43 and 46, the semiconducting layer 44, the antireflective layer 49 and a further electrode layer 60 along with electrodes 42 and 48.

Turning to FIG. 5i, the electrodes may be implemented as a pair of sense (62 and 66) and pair of bias electrodes (64 and 68). In this embodiment, the shield electrode 41 is located atop the substrate and shields each of the pair of sense and bias electrodes. In the embodiment of 5j, the shield electrode is located away from the substrate layer 40 but still shields the pair of sense and bias electrodes. Turning to FIG. 5k, the embodiment includes a pair of shield electrodes 41 with one adjacent the substrate layer 40 and the other away from the substrate layer 40. In the FIG. 5l embodiment, the shield electrode is located adjacent the substrate layer 40 and shields the three electrodes (two sense electrodes 62 and 66 and one bias electrode 64). In the embodiment of FIG. 5m, the shield electrode 41 (preferably transparent) is located away from the substrate layer 40 and shields the three electrodes. FIG. 5n shows a dual shield electrode embodiment for a three electrode implementation.

Figures 5W, 5X:
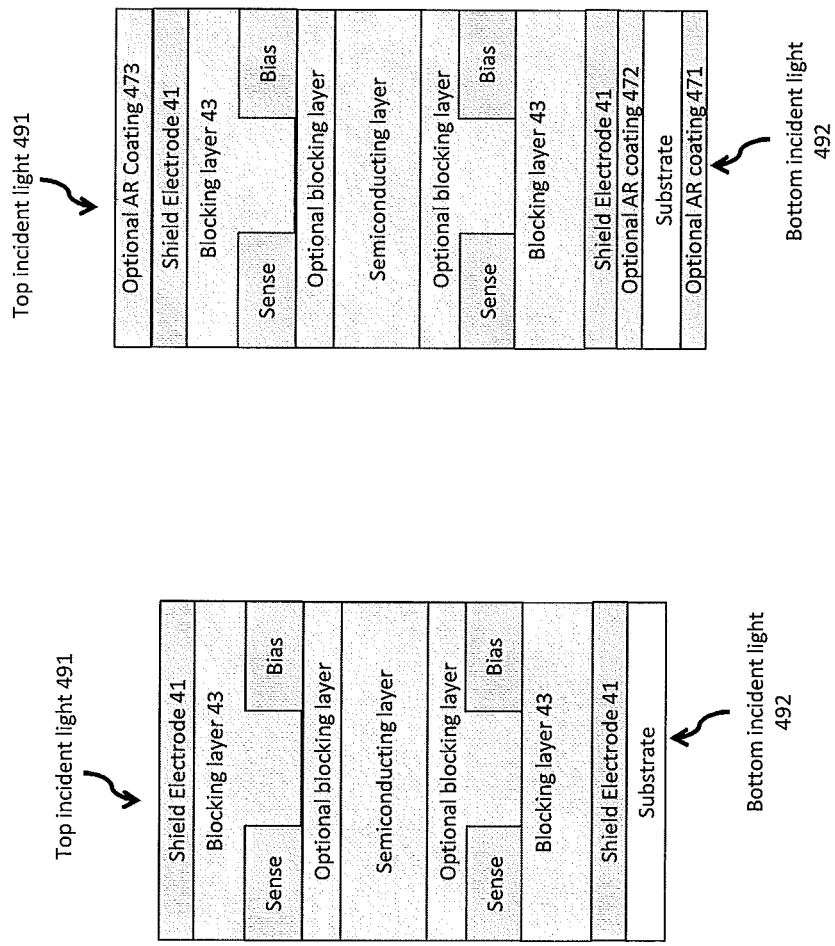
Figures 5Y, 5Z:
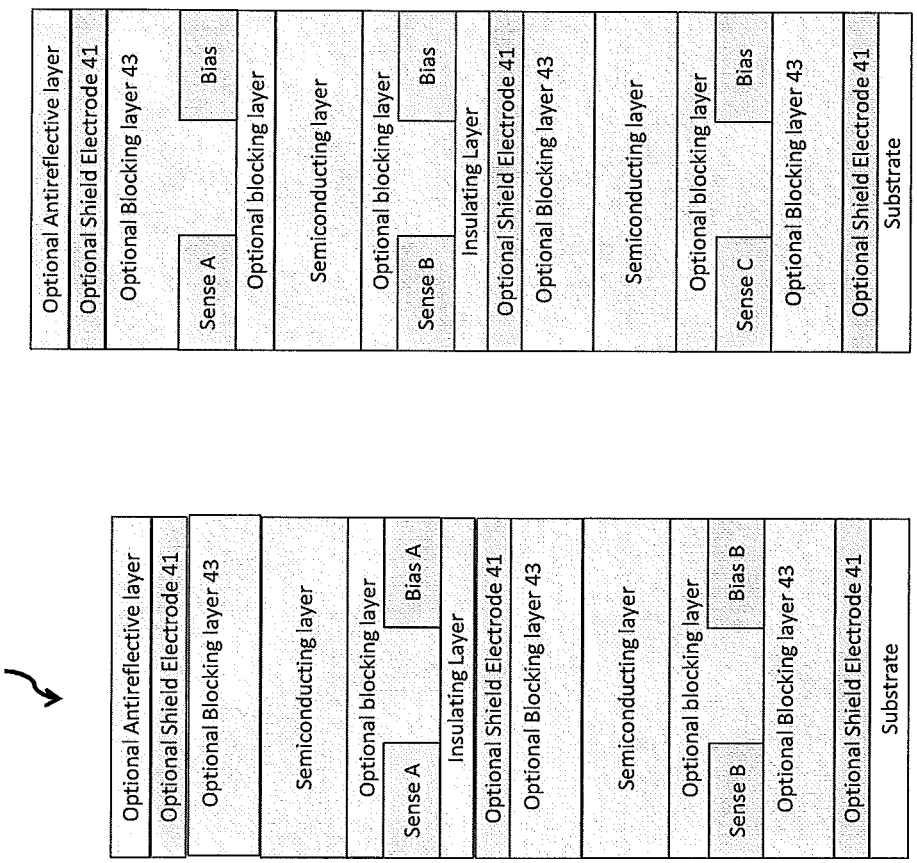

In the embodiments of 5o to 5ab, further examples of how at least one shield electrode may be integrated within a detector are shown. In the embodiment of FIG. 5x, the detector may further include optional antireflective coating adjacent either shield electrode. The antireflective coating may also be applied to both sides of the substrate layer.

Figure 6B:
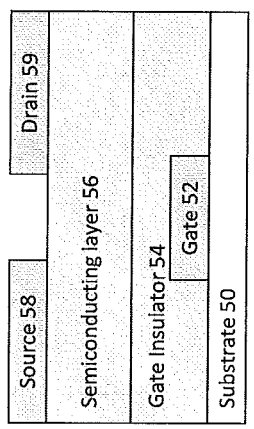
FIG. 6b illustrates a cross-section of a top-gate thin film transistor (TFT) configuration in accordance with the present disclosure.
Figure 6A:
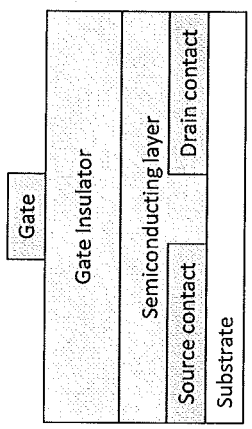
FIG. 6a illustrates a cross-section of a bottom-gate thin film transistor (TFT) configuration in accordance with the present disclosure.

FIG. 6a shows a bottom gate, inverted staggered thin film transistor (TFT) structure where a substrate 50 (e.g. glass or plastic) contains a patterned gate electrode 52, followed by a gate insulator 54, a semiconducting layer 56 and a patterned contact layer defining the source 58 and drain 59 contacts. FIG. 5b shows a top gate, inverted staggered TFT structure with the layers in a reverse configuration. Both are implementations of amorphous silicon TFTs in use by the display industry today. Similar cross-sections can be drawn for CMOS (complementary metal-oxide-semiconductor), IGZO and polysilicon transistors as understood by one skilled in the art.

Figure 7:
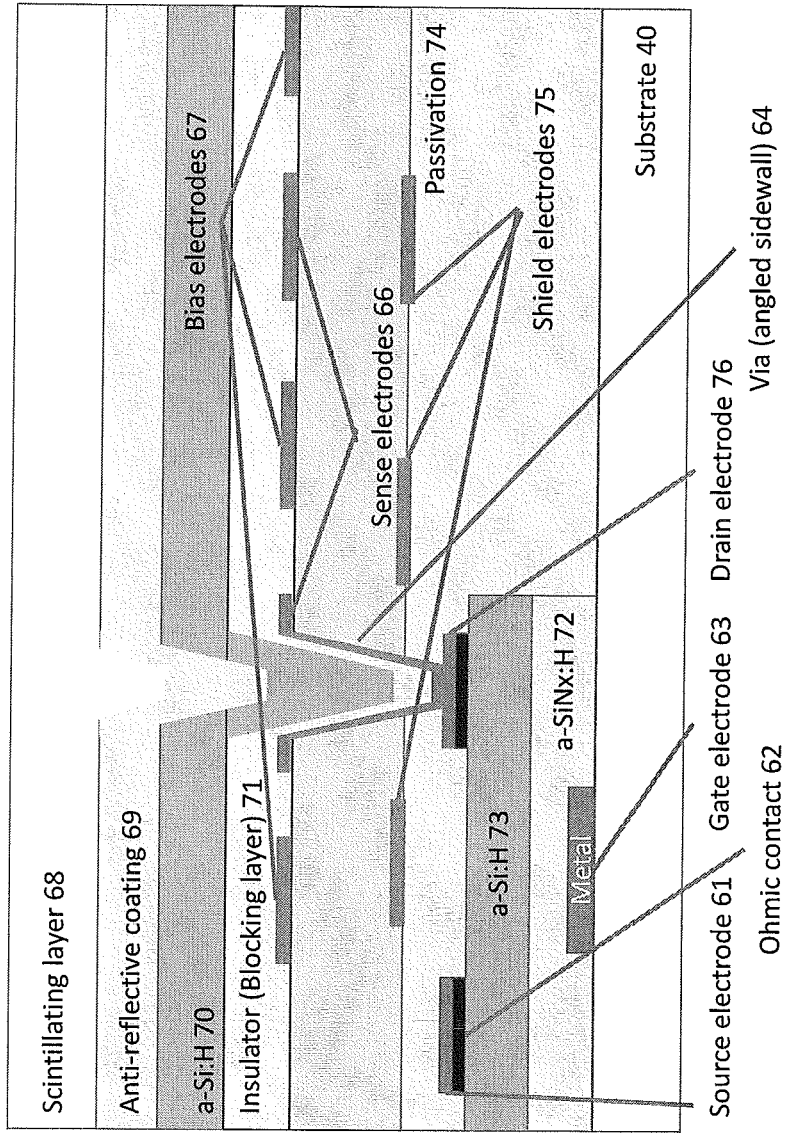
FIG. 7 is a schematic cross-section for an imager with shield electrode.

FIG. 7 shows one potential process cross-section for a MISIM-TFT imager with a shield electrode. The cross-section shown is for a bottom electrode MISIM using a bottom gate TFT. As would be understood by those skilled in the art, this implementation can be scaled to all of the other potential variants of MISIM shown in FIGS. 5a-5ab combined with the various TFT architectures discussed in FIG. 6.

In the preceding description, for purposes of explanation, numerous details are set forth in order to provide a thorough understanding of the embodiments. However, it will be apparent to one skilled in the art that these specific details may not be required. In other instances, well-known structures may be shown in block diagram form in order not to obscure the understanding. For example, specific details are not provided as to whether elements of the embodiments described herein are implemented as a software routine, hardware circuit, firmware, or a combination thereof.

Embodiments of the disclosure or components thereof can be provided as or represented as a computer program product stored in a machine-readable medium (also referred to as a computer-readable medium, a processor-readable medium, or a computer usable medium having a computer-readable program code embodied therein). The machine-readable medium can be any suitable tangible, non-transitory medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor or controller to perform steps in a method according to an embodiment of the disclosure. Those of ordinary skill in the art will appreciate that other instructions and operations necessary to implement the described implementations can also be stored on the machine-readable medium. The instructions stored on the machine-readable medium can be executed by a processor, controller or other suitable processing device, and can interface with circuitry to perform the described tasks.

The above-described embodiments are intended to be examples only. Alterations, modifications and variations can be effected to the particular embodiments by those of skill in the art without departing from the scope, which is defined solely by the claims appended hereto.

What is claimed is:

1. A detector element for a digital imaging system comprising:
    a first electrode;
    a second electrode;
    a semiconducting layer, located between the first and second electrode; and
    at least one conductive shielding electrode located in a shielding electrode plane parallel to one of the first or second electrode;
    wherein the shielding electrode plane is different than a plane of the first or second electrode; and
    wherein the first and second electrode are horizontally spaced and do not overlap each other.

2. The detector element of claim 1 further comprising at least one blocking layer.

3. The detector element of claim 2 further comprising an antireflective layer.

4. The detector element of claim 2 wherein the blocking layer is one of an insulating blocking layer, an ohmic blocking layer and a Schottky blocking layer.

5. The detector element of claim 1 further comprising a substrate layer.

6. The detector element of claim 5 wherein the shielding electrode is adjacent the substrate layer.

7. The detector element of claim 5 wherein the shielding electrode is away from the substrate layer.

8. The detector element of claim 7 wherein the shielding electrode is transparent.

9. The detector element of claim 5 wherein the shielding electrode extends a width of the substrate layer.

10. The detector element of claim 1 wherein the shielding electrode shapes an electric field near or around at least one of the first or second electrode.

11. The detector element of claim 1 wherein the shielding electrode layer shapes an electric field between the first and second electrode.

12. The detector element of claim 1 wherein the shielding electrode is manufactured from a conductive material.

13. The detector element of claim 12 wherein the conductive material is aluminum, chrome, molybdenum or indium tin oxide.

14. The detector element of claim 1 wherein the semiconductor layer is manufactured from at least one of amorphous silicon, metal-oxide, polysilicon and an organic semiconductor material.

15. The detector element of claim 14 wherein the blocking layer is manufactured from at least one of polyimide, benzocyclobutane (BCB), parylene, polystyrene or polysiloxane.

16. The detector element of claim 1 wherein the detector element is a Metal-Insulator-Semiconductor-Insulator-Metal (MISIM) detector element.

17. The detector element of claim 1 wherein the shielding electrode overlaps at most one of the first electrode or second electrode.

18. The detector element of claim 17 wherein the shielding electrode overlaps only one of the first electrode or second electrode.

19. The detector element of claim 18 wherein the shielding electrode partially or fully overlaps the one of the first electrode or second electrode.

20. The detector element of claim 17 wherein the shielding electrode does not overlap either the first electrode or second electrode.

* * * * *